(12) United States Patent
Lin et al.

(10) Patent No.: US 9,196,782 B2
(45) Date of Patent: Nov. 24, 2015

(54) DYE-SENSITIZED SOLAR CELL WITH HYBRID NANOSTRUCTURES AND METHOD FOR FABRICATING WORKING ELECTRODES THEREOF

(71) Applicant: NATIONAL YUNLIN UNIVERSITY OF SCIENCE AND TECHNOLOGY, Douliu, Yunlin County (TW)

(72) Inventors: Jian-Yang Lin, Douliu (TW); Chih-Kai Hu, Douliu (TW)

(73) Assignee: National Yunlin University of Science and Technology, Douliu, Yunlin County (TW)

( * ) Notice: Subject to any disclaimer, the term of this patent is extended or adjusted under 35 U.S.C. 154(b) by 534 days.

(21) Appl. No.: 13/742,977

(22) Filed: Jan. 16, 2013

(65) Prior Publication Data

US 2013/0130436 A1    May 23, 2013

Related U.S. Application Data

(62) Division of application No. 12/970,465, filed on Dec. 16, 2010, now abandoned.

(51) Int. Cl.
| | |
|---|---|
| *H01L 31/18* | (2006.01) |
| *H01G 9/20* | (2006.01) |
| *B82Y 30/00* | (2011.01) |
| *B82Y 40/00* | (2011.01) |

(52) U.S. Cl.
CPC .............. *H01L 31/1884* (2013.01); *B82Y 30/00* (2013.01); *H01G 9/2031* (2013.01); *B82Y 40/00* (2013.01); *H01G 9/2059* (2013.01); *Y02E 10/542* (2013.01)

(58) Field of Classification Search
CPC ...................................... H01L 31/1884
See application file for complete search history.

(56) References Cited

U.S. PATENT DOCUMENTS

| | | | | |
|---|---|---|---|---|
| 6,451,175 | B1 * | 9/2002 | Lal .......................... | B01J 19/088 |
| | | | | 204/173 |
| 2006/0260674 | A1 * | 11/2006 | Tran ....................... | G11C 13/02 |
| | | | | 136/252 |
| 2007/0137701 | A1 | 6/2007 | Sainte Catherine et al. | |
| 2008/0264482 | A1 * | 10/2008 | Lee .......................... | B82Y 10/00 |
| | | | | 136/256 |
| 2008/0299374 | A1 | 12/2008 | Choi et al. | |
| 2010/0078066 | A1 | 4/2010 | Darling et al. | |
| 2010/0139772 | A1 | 6/2010 | Frank et al. | |
| 2010/0187172 | A1 * | 7/2010 | Paulose .................. | B82Y 30/00 |
| | | | | 210/506 |

FOREIGN PATENT DOCUMENTS

TW             201001724      1/2010

* cited by examiner

*Primary Examiner* — Nathan T Leong
(74) *Attorney, Agent, or Firm* — Muncy, Geissler, Olds & Lowe, P.C.

(57) ABSTRACT

A dye-sensitized solar cell with hybrid nanostructures comprises a negative-polarity conductive substrate, a metal oxide layer, a positive-polarity conductive substrate and an electrolyte. The metal oxide layer has a plurality of nanoparticles and a plurality of nanotubes. The metal oxide layer and the electrolyte are arranged between the negative-polarity conductive substrate and the positive-polarity conductive substrate. The nanoparticles increase contact area with dye and thus enhance power generation efficiency. The nanotubes increase carrier mobility and thus effectively transfer electricity to electrodes. The solar cell integrates the advantages of nanoparticles and nanotubes and offsets the disadvantages thereof to effectively enhance the photovoltaic conversion efficiency of dye-sensitized solar cells.

4 Claims, 3 Drawing Sheets

DYE-SENSITIZED SOLAR CELL WITH HYBRID NANOSTRUCTURES AND METHOD FOR FABRICATING WORKING ELECTRODES THEREOF

CROSS REFERENCE TO RELATED APPLICATIONS

This application is a Divisional of co-pending application Ser. No. 12/970,465, filed on Dec. 16, 2010, and for which priority is claimed under 35 U.S.C. §120, the entire contents of which is hereby incorporated by reference.

FIELD OF THE INVENTION

The present invention relates to a solar cell, particularly to a dye-sensitized solar cell with hybrid nanostructures.

BACKGROUND OF THE INVENTION

In DSSC (Dye-Sensitized Solar Cell), dye molecules are chemically absorbed by metal oxide semiconductor nanoparticles; then, the nanoparticles are spread on the cathode to function as a photosensitive layer; an electrolyte is interposed between the photosensitive layer and the anode to assist in electric conduction. DSSC has the following advantages:
1. The photosensitive particles have an effective light absorption area 100 times greater than the surface area of the electrode. Therefore, DSSC has very high light absorption efficiency, using a very small amount of material.
2. The photosensitive particles are fabricated via merely soaking the semiconductor particles in a dye solution and drying the particles with an inert gas. Therefore, DSSC has a simple and inexpensive fabrication process.
3. The dye of DSSC has a wide absorption spectrum in the range of visible light. Therefore, a single type of DSSC elements can harness a wide spectrum of solar light.
4. DSSC is semitransparent and suitable to be a construction material, especially a window material. For example, DSSC may be used as glass curtain walls of high-rise buildings to provide functions of sunlight sheltering, thermal insulation and power generation. Therefore, a building may have efficacies of power saving and power generation via using DSSC.

Generally, a solar cell is expected to have low cost, low fabrication complexity, and high photovoltaic conversion efficiency. DSSC indeed has the characteristics of low cost and low fabrication complexity. However, the photovoltaic conversion efficiency thereof still needs improving. A R.O.C patent publication No. 201001724 disclosed a "Dye Sensitized Solar Cell Having a Double-Layer Nanotube Structure and Manufacture Method Thereof". The nanotube structures can increase the electric conduction efficiency of DSSC. However, nanotubes have less area to absorb dye than nanoparticles. Thus is decreased the photovoltaic conversion efficiency of the prior-art DSSC.

SUMMARY OF THE INVENTION

The primary objective of the present invention is to enhance the photovoltaic conversion efficiency of dye-sensitized solar cells.

To achieve the abovementioned objective, the present invention provides a dye-sensitized solar cell with hybrid nanostructures, which comprises a negative-polarity conductive substrate, a positive-polarity conductive substrate, a metal oxide layer and an electrolyte. The metal oxide layer is arranged between the negative-polarity conductive substrate and the positive-polarity conductive substrate. The metal oxide layer has a plurality of nanoparticles and a plurality of nanotubes. The nanoparticles and nanotubes are arranged alternately. The metal oxide layer is adhered to the negative-polarity conductive substrate. The electrolyte is arranged between the negative-polarity conductive substrate and the positive-polarity conductive substrate to implement redox reactions of the metal oxide layer.

The present invention also provides a method for fabricating a dye-sensitized solar cell with hybrid nanostructures, which comprises steps: fabricating nanotubes with an anodizing method; breaking off the nanotubes via a vibration method; mixing the nanotubes with nanoparticles to obtain a metal oxide mixture; and spreading the metal oxide mixture on a conductive substrate to obtain a working electrode of a dye-sensitized solar cell.

The nanoparticles can effectively increase the contact area between the metal oxide mixture and dye and thus enhance the photovoltaic conversion efficiency of DSSC. The nanotubes can increase the carrier mobility to effectively transfer electric energy to the electrodes. The present invention combines the advantages of nanoparticles and nanotubes and offset the disadvantages thereof to obtain greater dye absorption area and higher carrier mobility and improve the photovoltaic conversion efficiency of a dye-sensitized solar cell.

DETAILED DESCRIPTION OF THE PREFERRED EMBODIMENTS

The technical contents of the present invention are described in detail in cooperation with the drawings below.

Figure 1:
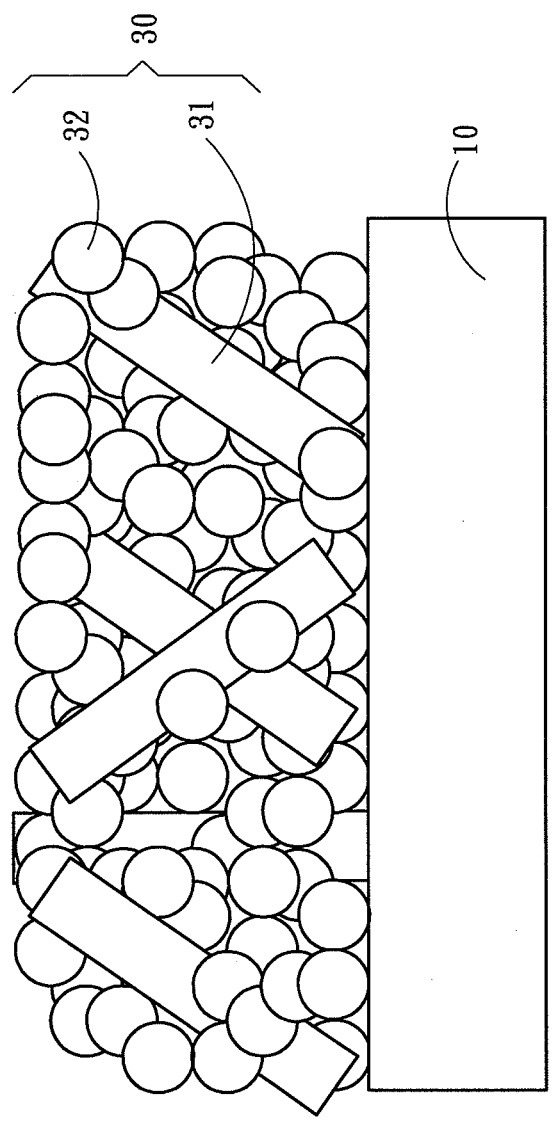
FIG. 1 is a diagram schematically showing the structure of a working electrode of a dye-sensitized solar cell according to one embodiment of the present invention.
Figure 2:
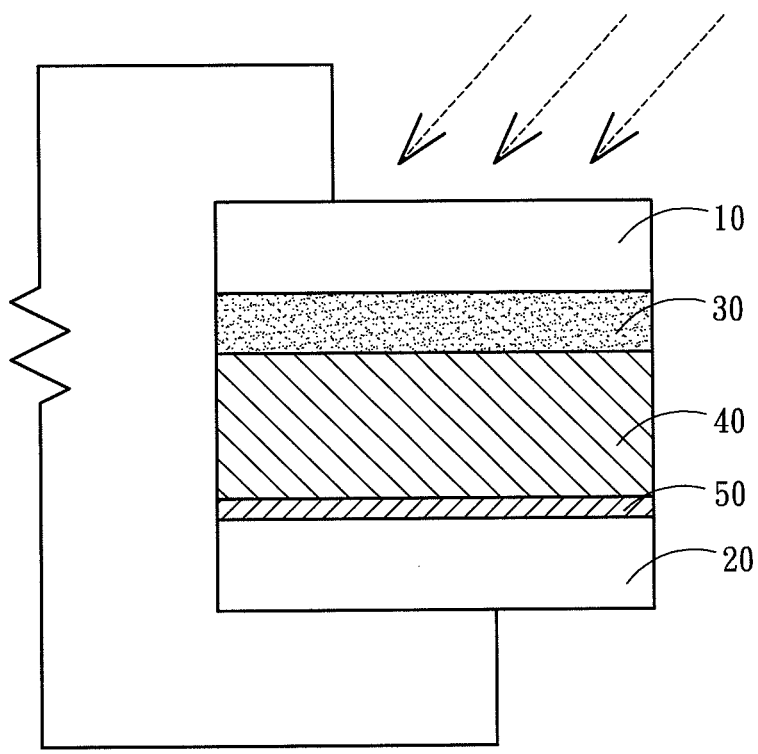
FIG. 2 is a diagram schematically showing the structure of a dye-sensitized solar cell according to one embodiment of the present invention.

Refer to FIG. 1 and FIG. 2 respectively diagrams schematically showing structures of a working electrode and a dye-sensitized solar cell according to one embodiment of the present invention. The present invention provides a dye-sensitized solar cell with hybrid nanostructures, which comprises a negative-polarity conductive substrate 10, a positive-polarity conductive substrate 20, a metal oxide layer 30 and an electrolyte 40. The metal oxide layer 30 is arranged between the negative-polarity conductive substrate 10 and the positive-polarity conductive substrate 20. The metal oxide layer 30 has a plurality of nanoparticles 32 and a plurality of nanotubes 31. The nanoparticles 32 and nanotubes 31 are arranged alternately. The metal oxide layer 30 is adhered to the negative-polarity conductive substrate 10. The electrolyte 40 is arranged between the negative-polarity conductive substrate 10 and the positive-polarity conductive substrate 20 to implement redox reactions of the metal oxide layer 30. In the embodiment shown in FIG. 2, the metal oxide layer 30 is arranged on one side of the negative-polarity conductive substrate 10; the electrolyte 40 is arranged between the metal oxide layer 30 and the positive-polarity conductive substrate 20. A catalytic layer 50 is arranged between the electrolyte 40 and the positive-polarity conductive substrate 20. The catalytic layer 50 is made of platinum in this embodiment. The process of absorbing light and generating electricity is the basic principle of DSSC and will not repeat here.

The nanotubes 31 are grown with an anodizing method. In this embodiment, the metal oxide layer 30 is made of titanium dioxide. The nanotubes 31 are grown from titanium with an anodizing method. Then the nanotubes 31 are broken off with a vibration method and collected. The nanotubes 31 and nanoparticles 32 are arranged alternately. The negative-polarity conductive substrate 10 and the positive-polarity conductive substrate 20 are made of ITO (Indium Tin Oxide). A dye sensitizer adheres to the surface of the nanoparticles 32 and nanotubes 31.

Figure 3:
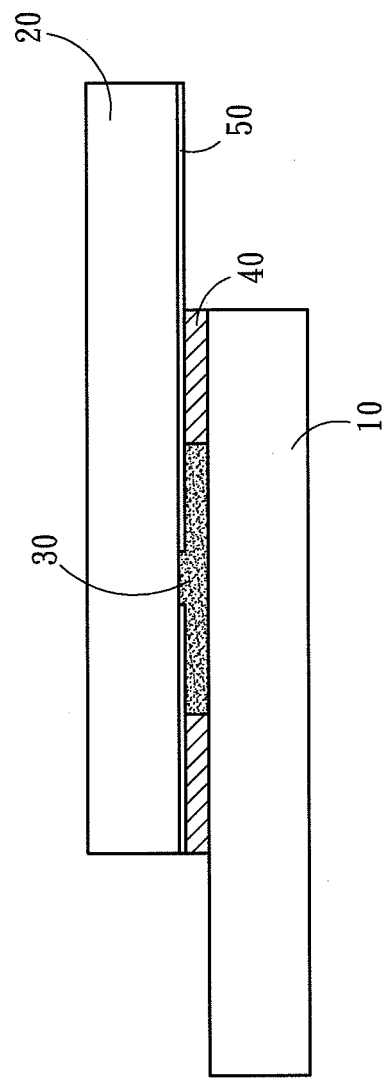
FIG. 3 is a diagram schematically showing the structure of a dye-sensitized solar cell according to another embodiment of the present invention.

Refer to FIG. 3 a diagram schematically showing the structure of a dye-sensitized solar cell according to another embodiment of the present invention. In this embodiment, the electrolyte 40 is arranged on two sides of the metal oxide layer 30. Such a structure can also implement the redox reaction of DSSC.

The present invention also provides a method for fabricating a dye-sensitized solar cell with hybrid nanostructures, which comprises steps:

S1: fabricating nanotubes 31, wherein an anodizing method is used to grow a plurality of nanotubes 31 from a metal substrate; in one embodiment, the metal substrate is made of titanium (Ti);

S2: fabricating a metal oxide mixture, wherein the nanotubes 31 are broken off by vibration and then mixed with nanoparticles 32 to form a metal oxide mixture;

S3: fabricating an electrode, wherein the metal oxide mixture is spread on a conductive substrate to form a negative-polarity conductive substrate 10 functioning as a working electrode; in one embodiment, the metal oxide mixture is spread on the conductive substrate with a spin-coating method.

The abovementioned steps can only fabricate the negative-polarity conductive substrate 10. To complete a solar cell further needs the following steps:

S4: dye adhering, wherein the negative-polarity conductive substrate 10 is soaked in a dye sensitizer to make dye adhere to the surface of the nanoparticles 32 and nanotubes 31;

S5: joining the negative-polarity conductive substrate 10 with the positive-polarity conductive substrate 20 to complete a solar cell, wherein the positive-polarity conductive substrate 20 is adhered to one side of the negative-polarity conductive substrate 10 having the metal oxide mixture by an electrolyte 40.

As the nanoparticles 32 have larger contact area for adhering dye, they can effectively convert light energy into electric energy. However, there are only point contacts among particles. Therefore, the nanoparticles 32 have poor electric conductivity. Although the nanotubes 31 have smaller surface area, they can effectively conduct electricity to the conductive substrates via the tube structure thereof. The electricity generated by the nanoparticles 32 is transmitted to the nanotubes 31 via the contact points between the nanoparticles 32 and the nanotubes 31, and the nanotubes 31 collect and send out electricity. As dye also adheres to the surface of the nanotubes 31, the nanotubes 31 generate electricity too.

In summary, the nanoparticles 32 increase the contact area between dye and the metal oxide mixture and thus enhance the photovoltaic conversion efficiency of the solar cell. The nanotubes 31 increase carrier mobility and thus effectively transfer electricity to electrodes. The present invention integrates the advantages of nanoparticles 32 and nanotubes 31 and offsets the disadvantages thereof to achieve large dye-adhering area and high carrier mobility so as to enhance the photovoltaic conversion efficiency of DSSC.

What is claimed is:

1. A method for fabricating working electrodes of a dye-sensitized solar cell, comprising steps:

growing a plurality of nanotubes from a metal substrate with an anodizing method;

breaking off the nanotubes via vibration, and mixing the nanotubes with nanoparticles to form a metal oxide mixture; and spreading the metal oxide mixture on a conductive substrate.

2. The method for fabricating working electrodes of a dye-sensitized solar cell according to claim 1, wherein the metal oxide mixture is spread on the conductive substrate with a spin-coating method.

3. The method for fabricating working electrodes of a dye-sensitized solar cell according to claim 1 further comprising a step of soaking the conductive substrate in a dye sensitizer.

4. The method for fabricating working electrodes of a dye-sensitized solar cell according to claim 1, wherein the conductive substrate coated with the metal oxide mixture functions as a negative-polarity conductive substrate, and further comprising a step of integrating the negative-polarity conductive substrate and a positive-polarity conductive substrate to form a solar cell.

\* \* \* \* \*